US011558970B2

(12) United States Patent
Li et al.

(10) Patent No.: US 11,558,970 B2
(45) Date of Patent: Jan. 17, 2023

(54) SUPPORT MODULE, SUPPORT ASSEMBLY, AND DISPLAY APPARATUS

(71) Applicant: Top Victory Investments Limited, Hong Kong (HK)

(72) Inventors: Quan Bo Li, Fuqing (CN); Li-Wei Lin, New Taipei (TW)

(73) Assignee: TOP VICTORY INVESTMENTS LIMITED, Hong Kong (HK)

( * ) Notice: Subject to any disclaimer, the term of this patent is extended or adjusted under 35 U.S.C. 154(b) by 23 days.

(21) Appl. No.: 17/198,033

(22) Filed: Mar. 10, 2021

(65) Prior Publication Data

US 2022/0217856 A1 Jul. 7, 2022

(30) Foreign Application Priority Data

Jan. 5, 2021 (TW) ................................ 110100276

(51) Int. Cl.

| | |
|---|---|
| ***H05K 5/02*** | (2006.01) |
| ***G09F 7/20*** | (2006.01) |
| ***G09F 9/33*** | (2006.01) |
| ***H05K 5/00*** | (2006.01) |
| *G09F 9/35* | (2006.01) |
| *G09F 7/18* | (2006.01) |
| *H01L 25/10* | (2006.01) |
| *H01L 25/13* | (2006.01) |

(52) U.S. Cl.

CPC ............. *H05K 5/0217* (2013.01); *G09F 7/20* (2013.01); *G09F 9/33* (2013.01); *H05K 5/0017* (2013.01); *G09F 9/35* (2013.01); *G09F 2007/1843* (2013.01); *H01L 25/105* (2013.01); *H01L 25/13* (2013.01); *H05K 5/0021* (2013.01)

(58) Field of Classification Search

USPC ........ 361/728, 752, 796, 800, 807, 809, 810

See application file for complete search history.

(56) References Cited

U.S. PATENT DOCUMENTS 7,002,810 B1 * 2/2006 Becker ................. H05K 7/1421 361/825

FOREIGN PATENT DOCUMENTS

| | | |
|---|---|---|
| CN | 101546503 B | 8/2011 |
| CN | 105852451 B | 1/2018 |
| KR | 20190001331 A | 1/2019 |

OTHER PUBLICATIONS

Search Report issued to European counterpart application No. 21162622.1 by the EPO dated Sep. 22, 2021 (7 pages).

Search Report appended to an Office Action, which was issued to Taiwanese counterpart application No. 110100276 by the TIPO dated Nov. 22, 2021, with an English translation thereof.

* cited by examiner

*Primary Examiner* — Hung S. Bui

(74) *Attorney, Agent, or Firm* — Hamre, Schumann, Mueller & Larson, P.C.

(57) ABSTRACT

A support module includes a housing framework, two guide rail units disposed within a receiving space of the housing framework and spaced apart from each other, and a carrier connected between the guide rail units and movable on the guide rail units toward and away from a front opening of the housing framework for carrying a display panel unit. A support assembly which includes a plurality of the support modules juxtaposed to each other, and a display apparatus which includes a display panel unit supported by the support module are also disclosed.

13 Claims, 12 Drawing Sheets

100 20 25 30 10 12 11 12 11 2 24 27 27 26 30

SUPPORT MODULE, SUPPORT ASSEMBLY, AND DISPLAY APPARATUS

CROSS-REFERENCE TO RELATED APPLICATION

This application claims priority to Taiwanese Patent Application No. 110100276, filed on Jan. 5, 2021.

FIELD

The disclosure relates to a support module, and more particularly to a support module for supporting a display panel, a support assembly including the support module juxtaposed to each other, and a display apparatus including the display panel unit and the support module.

BACKGROUND

An LED display assembly is widely used for commercial display applications. Particularly, in order to display products and attract customers, a retailer usually places an LED display assembly behind a shop window by a wall mount or a hanging method for demonstrating and promoting the products.

Based on maintenance requirements for the LED display assembly, a support box is used at a front or rear end of the LED display assembly to support a maintenance worker for maintenance of a display module of the LED display assembly. In order to maintain the LED display screen, a sufficient distance must be provided between a window glass of the shop window and the LED display assembly regardless of whether the support box is configured for being maintained or repaired at the front or rear of the LED display assembly.

Because the LED display assembly has to be sufficiently distant from the glass panel of the shop window, the space therebetween can become a reflection site when light rays outside of the shop window is intensive, so that the display effect of the LED display assembly is reduced. In addition, when the distance between the LED display assembly and the shop window is excessive, a viewing angle of the LED display assembly is limited.

SUMMARY

Therefore, one object of the disclosure is to provide a support module that can alleviate at least one of the drawbacks of the prior art.

According to the disclosure, a support module includes a housing framework, two guide rail units, and a carrier. The housing framework includes a top side, a bottom side, a front side, a rear side, left and right lateral sides, a receiving space defined between the top and bottom sides, between the front and rear sides, and between the left and right lateral sides, a front opening formed at the front side in communication with the receiving space, and at least one lateral opening formed at one of the left and right sides in communication with the receiving space. The guide rail units is disposed within the receiving space and spaced apart from each other. The carrier is connected between the guide rail units and movable on the guide rail units toward and away from the front opening.

Another object of the disclosure is to provide a support assembly.

According to another object of the disclosure, a support assembly includes a plurality of the abovementioned support modules juxtaposed to each other in a left-right direction.

Still another object of the disclosure is to provide a display apparatus.

According to the disclosure, a display apparatus includes a display panel unit and the abovementioned support module.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
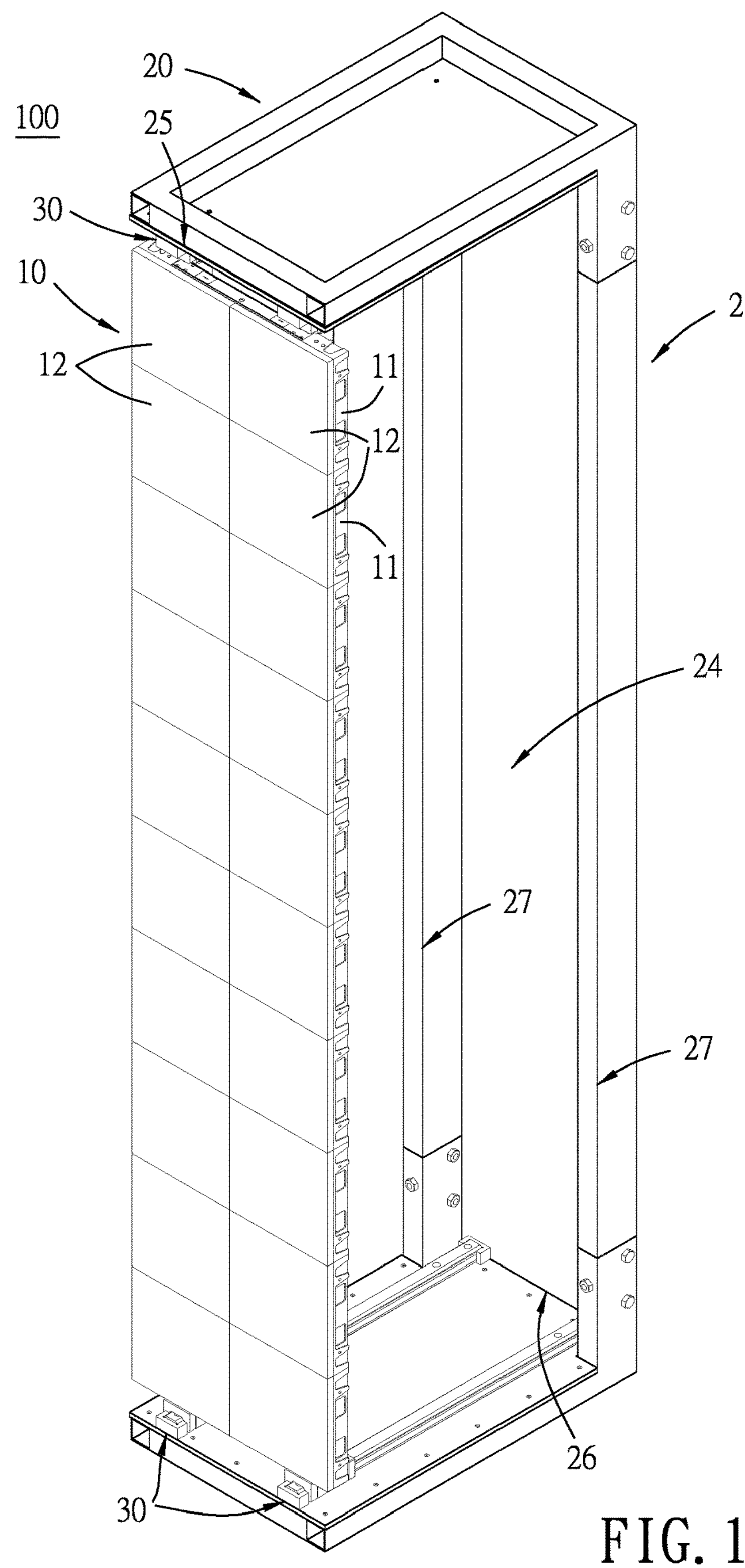
FIG. 1 is a perspective view illustrating a display apparatus according to an embodiment of the disclosure.

FIG. 1 illustrates a display apparatus 100 according to an embodiment of the disclosure. The display apparatus 100 includes a display panel unit 10 and a support module 20. The display panel unit 10 includes a plurality of carrier boxes 11 stacked on each other in a top-bottom direction, and a plurality of display modules 12. In this embodiment, each display module 12 is an LED display module, but is not limited hereto, and may be an LCD display module, a plasma display module, and so on. Each carrier box 11 carries two of the display modules 12.

Figure 2:
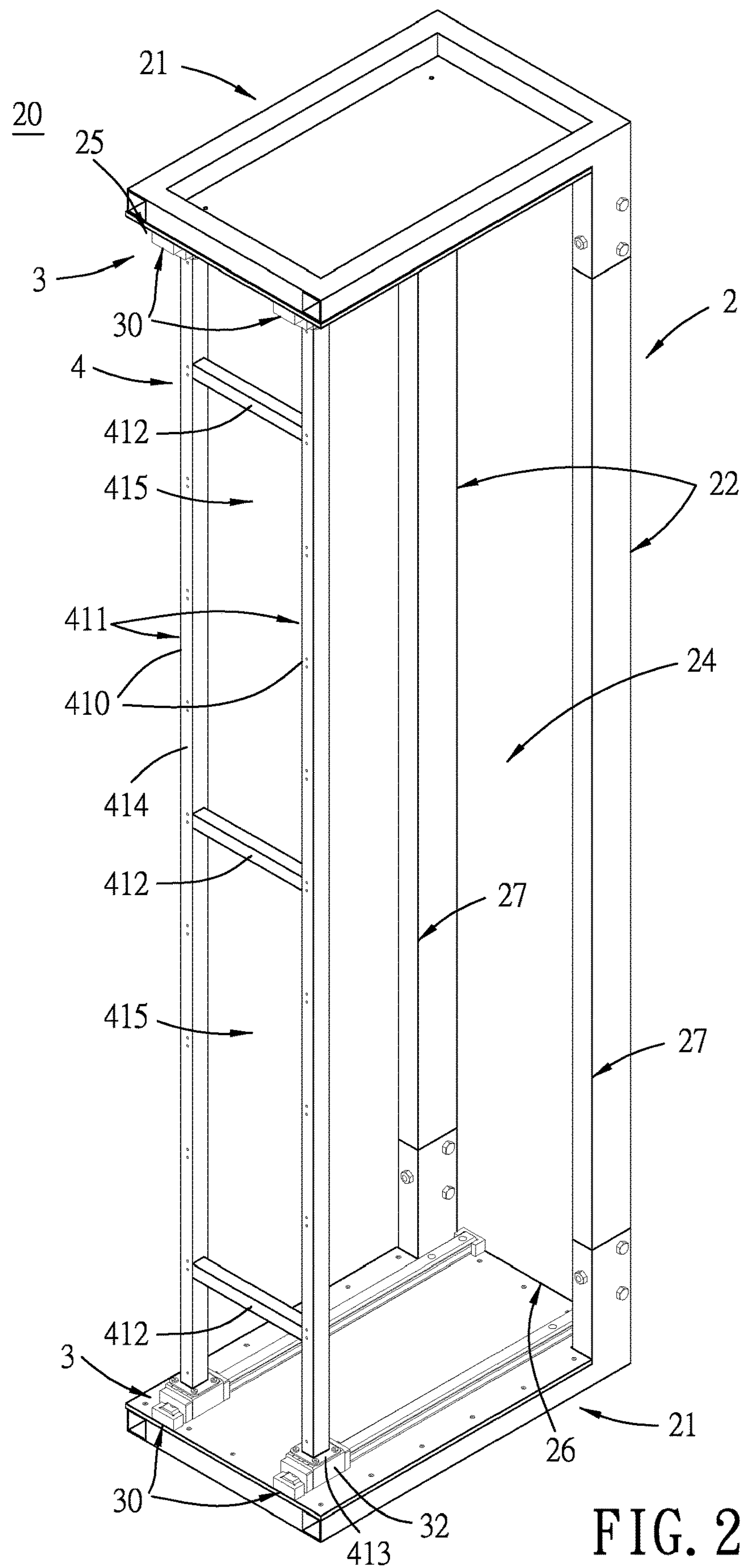
FIG. 2 is a perspective view of the embodiment illustrating a support module of the display apparatus.
Figure 3:
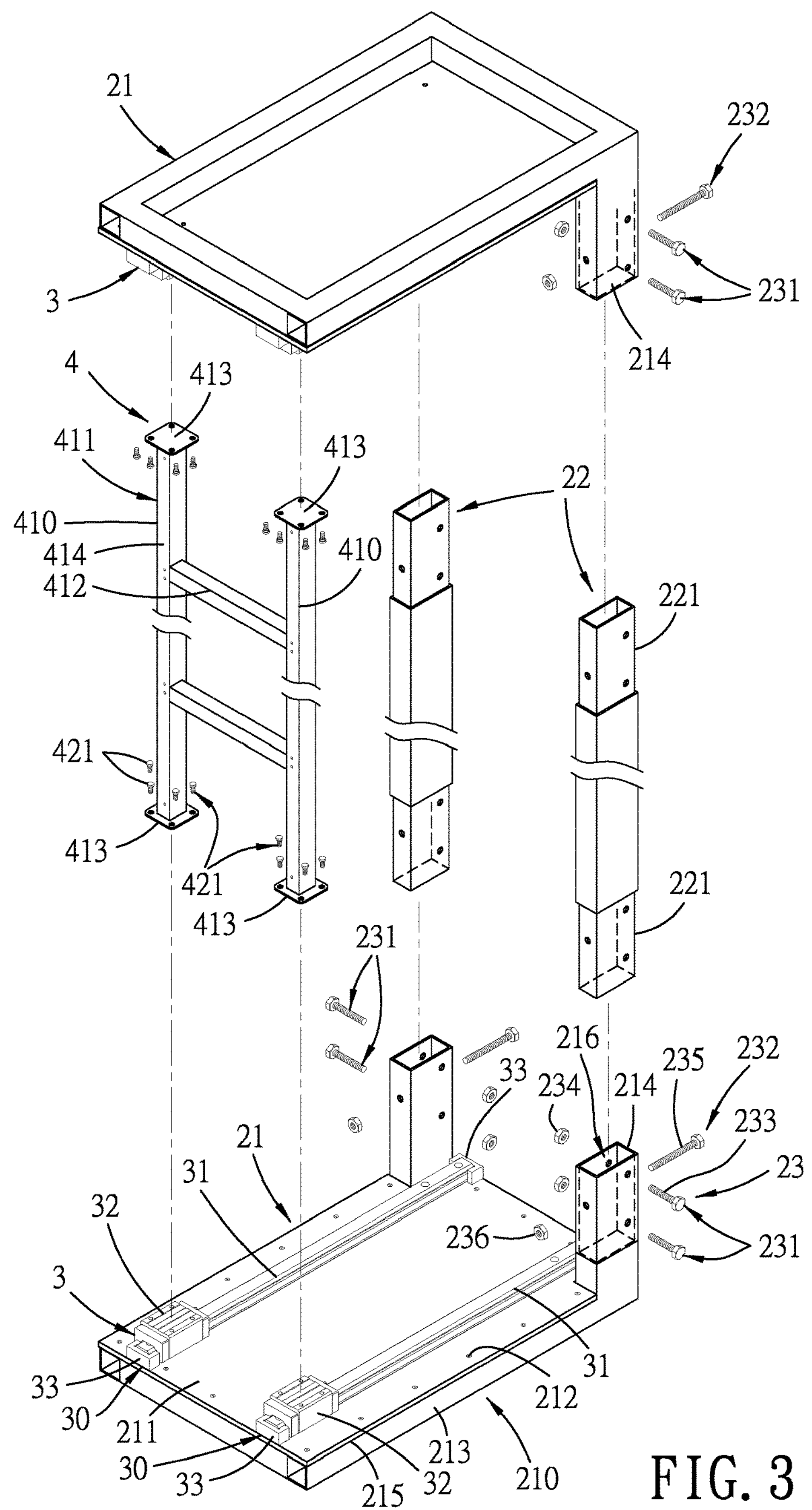
FIG. 3 is a fragmentary exploded perspective view of embodiment illustrating a housing framework, two guide rail units, and a carrier of the support module.
Figure 4:
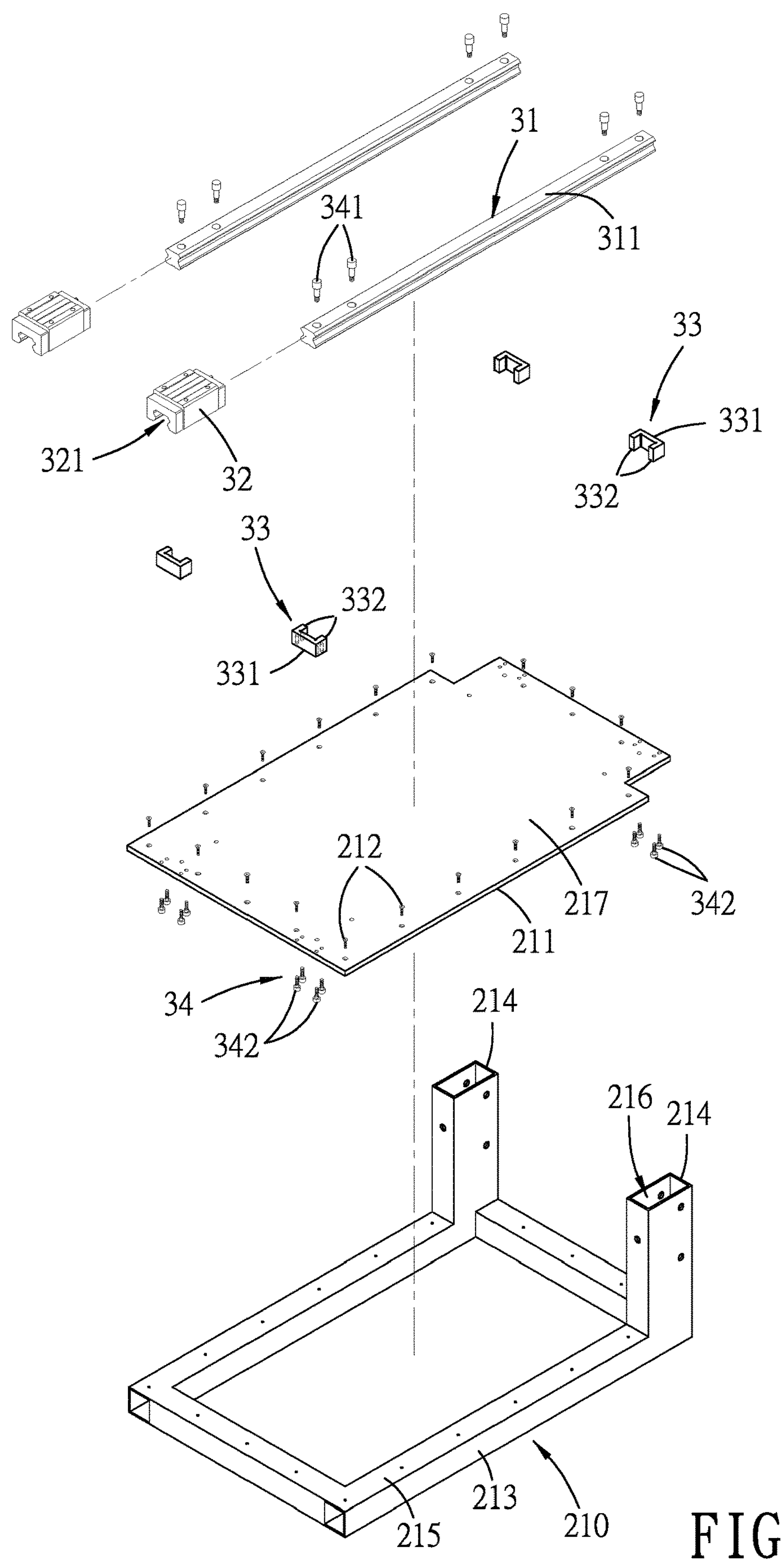
FIG. 4 is an exploded view of the embodiment illustrating two slide rails of one of guide rail units, and a frame body and a plate of a frame of the housing framework.

Referring to FIGS. 2 to 4, the support module 20 includes a housing framework 2, two guide rail units 3, and a carrier 4. The housing framework 2 has a front side provided with a front opening 25, a rear side provided with a rear opening 26, and two lateral sides respectively provided with two lateral openings 27.

The housing framework 2 further has two frames 21, two connection rods 22, and a fastening unit 23. The frames 21 are respectively disposed at top and bottom sides of the housing framework 2. Each frame 21 has a frame body 210, a plate 211, and a plurality of screws 212. The frame body 210 has a framing member 213 and two sleeve pipes 214. The framing member 213 is of a rectangular hollow shape and has a supporting surface 215 to support the plate 211. The sleeve pipes 214 extend upwardly from the supporting surface 215 at a rear side of the housing framework 2, and are spaced apart from each other in a left-right direction. Each sleeve pipes 214 has an insertion space 216 for insertion of a corresponding one of the connection rods 22. The screws 212 fasten the plate 211 to the supporting surface 215 of the framing member 213. The plate 211 has a bearing surface 217 opposite to the supporting surface 215.

The connection rods 22 are respectively disposed at the left and right sides. Each connection rod 22 is a rectangular pipe and has inserting ends 221 opposite to each other in the top-bottom direction. The inserting ends 221 of each connection rod 22 are respectively inserted into the insertion spaces 216 of the sleeve pipes 214 of the support frames 21 disposed at the top and bottom sides, so that each of the connection rods 22 is connected between rear ends of the support frames 21.

The fastening unit 23 includes a plurality of first fasteners 231 six of which are shown in FIG. 3 and second fasteners 232 three of which are shown in FIG. 3. Each first fastener 231 includes a first bolt 233 and a first nut 234. The first bolts 233 extend in the left-right direction through the sleeve pipes 214 and the insertion ends 221 of the connection rods 22 and are threaded into the first nuts 234, thereby securing the sleeve pipes 214 and the insertion ends 221 of the connection rods 22. Each second fastener 232 has a second bolt 235 and a second nut 236. The second bolts 235 extend in the front-rear direction through the sleeve pipes 214 and the insertion ends 221 of the connection rods 22 and are threaded into the second nuts 236, thereby securing the sleeve pipes 214 and the insertion ends 221 of the connection rods 22. By virtue of the first and second fasteners 231, 232, the connection rods 22 are stably connected to the sleeve pipes 214.

The front opening 25 is defined between front ends of the frames 21. The frames 21 and the connection rods cooperatively define a receiving space 24 in communication with the front opening 25. The rear ends of the frames 21 and the connecting rods 22 cooperatively define the rear opening 26 disposed behind and in communication with the receiving space 24. Each of the frames 21 has left and right lateral ends each connecting between the front and rear ends of a corresponding one of the frames 21. The left lateral ends of the frames 21 and one of the connecting rods 22 cooperatively define one of the lateral openings 27. The right lateral ends of the frames 21 and the other one of the connecting rod 22 cooperatively define the other one of the lateral openings 27.

Referring to FIG. 4 in combination with FIG. 3, the guide rail units 3 are mounted respectively on the frames 21 at the top and bottom sides of the housing framework 2 and are disposed within the receiving space 24. Each of the guide rail units 3 includes two slide rails 30 that are attached to the bearing surface 217 of the plate 211 of one of the frames 21 facing the receiving space 24 and that are spaced apart from each other in a left-right direction. Each slide rail 30 includes a linear rail member 31, a sliding block 32, two stop blocks 33, a fixing unit 34, and a track brake 35 (see FIG. 5). The linear rail member 31 supported by the bearing surface 217 extends in the front-rear direction, and has a front end situated at the front side of the housing framework 2, a rear end situated at the rear side of the housing framework 2, and a slide surface 311 connected between the front and rear ends of the linear rail member 31 away from the bearing surface 217. The sliding block 32 has a sliding recess 321 slidably connected to the linear rail member 31.

The stop blocks 33 are mounted on the bearing surface 217. Each stop block 33 has a block body 331, and two lateral protrusions 332 projecting respectively from left and right sides of the block body 331 toward the other one of the stop blocks 33. The block bodies 331 of the stop blocks 33 are disposed respectively on front and rear ends of the linear rail member 31. The two lateral protrusions 332 of each stop block 33 are respectively disposed on left and right sides of the linear rail member 31.

The fixing unit 34 includes a plurality of first screws 341 and a plurality of second screws 342. The first screws 341 secure the linear rail members 31 of the two slide rails 30 to the plate 211 of the corresponding frame 21. The second screws 342 secure the stop blocks 32 to the corresponding plate 211.

Figure 5:
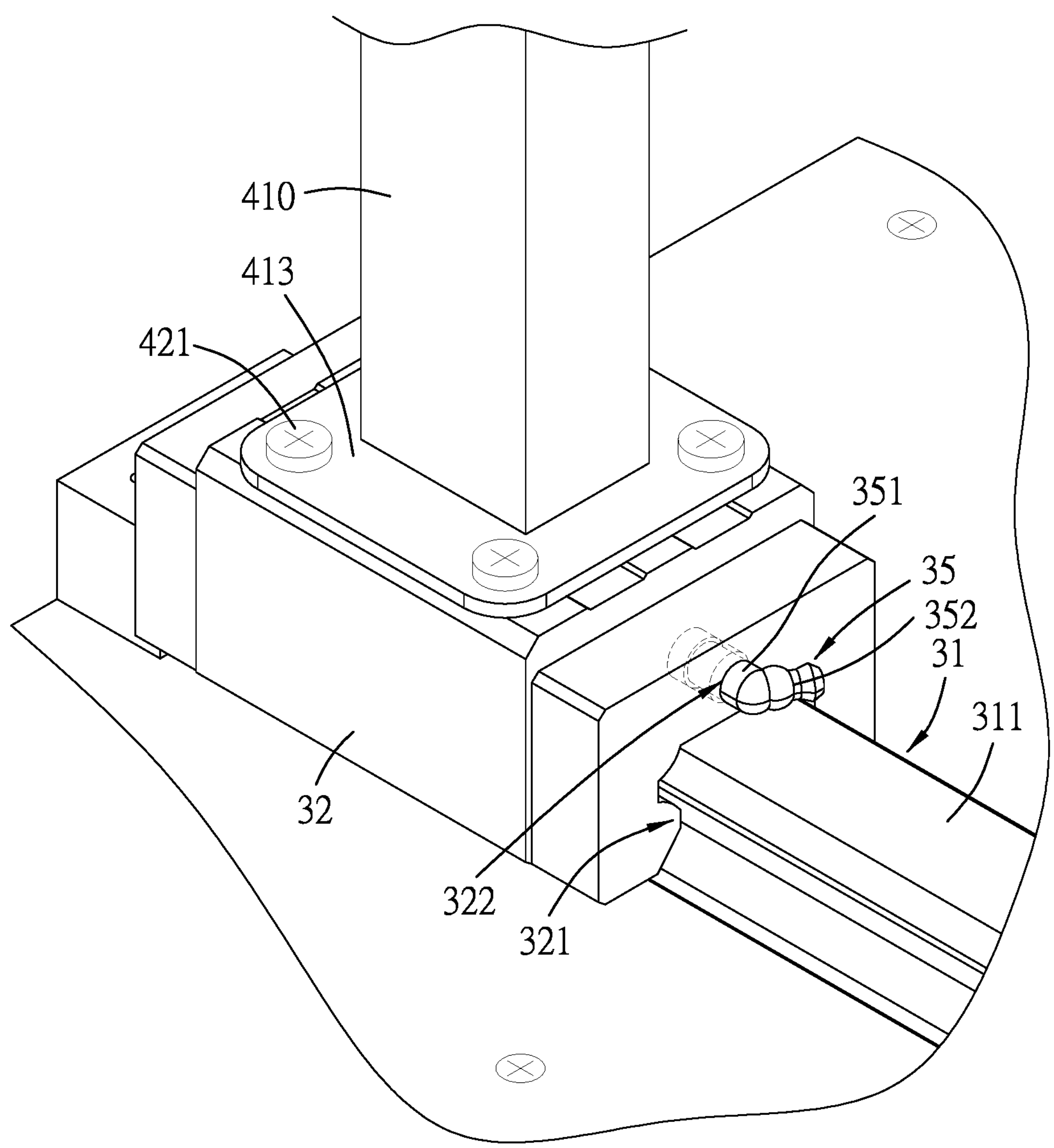
FIG. 5 is a partially enlarged perspective view of the embodiment.

Referring to FIG. 5, the sliding block 32 has a pivot hole 322 formed in a rear end thereof. The track brake 35 is a V-shaped rod and has a connecting arm 351 and a braking arm 352 angled from the connecting arm 351. The connecting arm 351 is pivotably inserted into the pivot hole 322 and partially projects outwardly from the pivot hole 322 so as to extend away from the rear end of the sliding block 32. The braking arm 352 bends from the connecting arm 351. The track brake 35 is rotatable relative to the sliding block 32 between a non-braking position (see FIG. 7) and a braking position (see FIG. 8). As the track brake 35 is rotated to the non-braking position, the braking arm 352 is moved away from the slide surface 311 of the linear rail member 31, so that the sliding block 32 is slidable on the linear rail member 31. As the track brake 35 is rotated to the braking position, the braking arm 352 is placed in pressing contact with the slide surface 311 of the linear rail member 31 for locking the sliding block 32 against movement.

Referring back to FIGS. 2, 3 and 5, the carrier 4 is connected between the guide rail units 3 and movable along the guide rail units 3 toward and away from the front opening 25. In this embodiment, the carrier 4 includes two upright rods 411 spaced apart from each other in the left-right direction, and a plurality of transverse rods 412 connected between the upright rods 411 and spaced apart from each other in the top-bottom direction. Each upright rod 411 has a rod body 410 and two end flange plates 413. The rod body 410 has an installation surface 414 for installation of the carrier boxes 1 of the display panel unit 10 (see FIG. 1). The end flange plates 413 are respectively welded to top and bottom ends of the rod body 410. The end flange plate 413 at the top end of the rod body 410 is connected to the sliding block 32 of one of the slide rails 30 of one of the guide rail units 3 at the top side. The end flange plate 413 at the bottom end of the rod body 410 is connected to the slide block 32 of one of the slide rails 30 of the other one of the guide rail units 3 at the bottom side. The carrier 4 further includes a plurality of maintenance through holes 415 that are spaced apart from each other in the top-bottom direction and that extend through front to rear carrier surfaces of the carrier 4. Each maintenance through hole 415 is defined by two adjacent transverse rods 412 and the upright rods 411. The end flange plates 413 are secured to the sliding block 32 by screws 421. By virtue of the sliding blocks 32 of the slide rails 30, the carrier 4 is slidable on the slide rails 30 to move backward from the front opening 25 to a rear position (see FIG. 6), or forward towards the front opening 25 to reach a front position (see FIG. 10). One of the stop blocks 33 is used to abut a front side of the sliding block 32 when the carrier 4 is placed at the front position. The other one of the stop blocks 33 is used to abut a rear side of the sliding block 32 when the carrier 4 is placed at the rear position.

Figure 6:
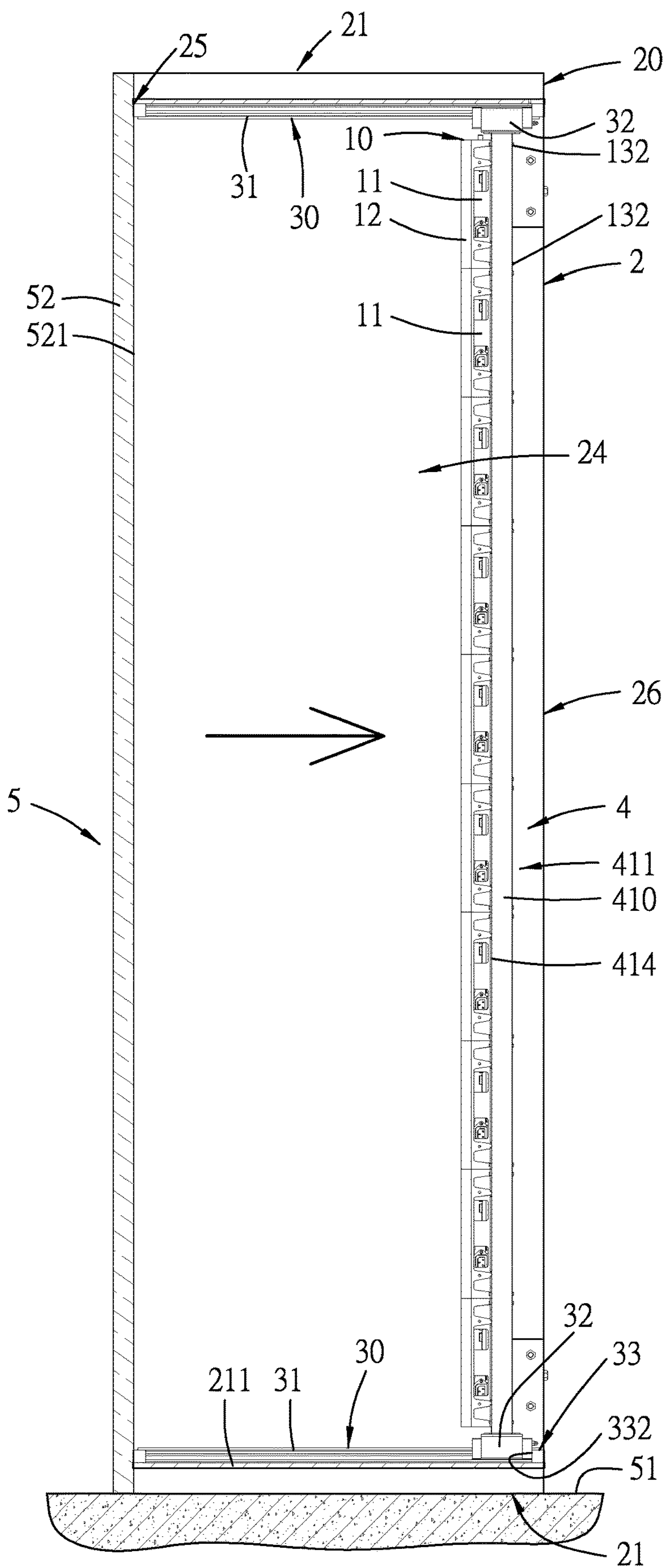
FIG. 6 is a sectional view illustrating the display apparatus disposed behind a shop window.
Figure 7:
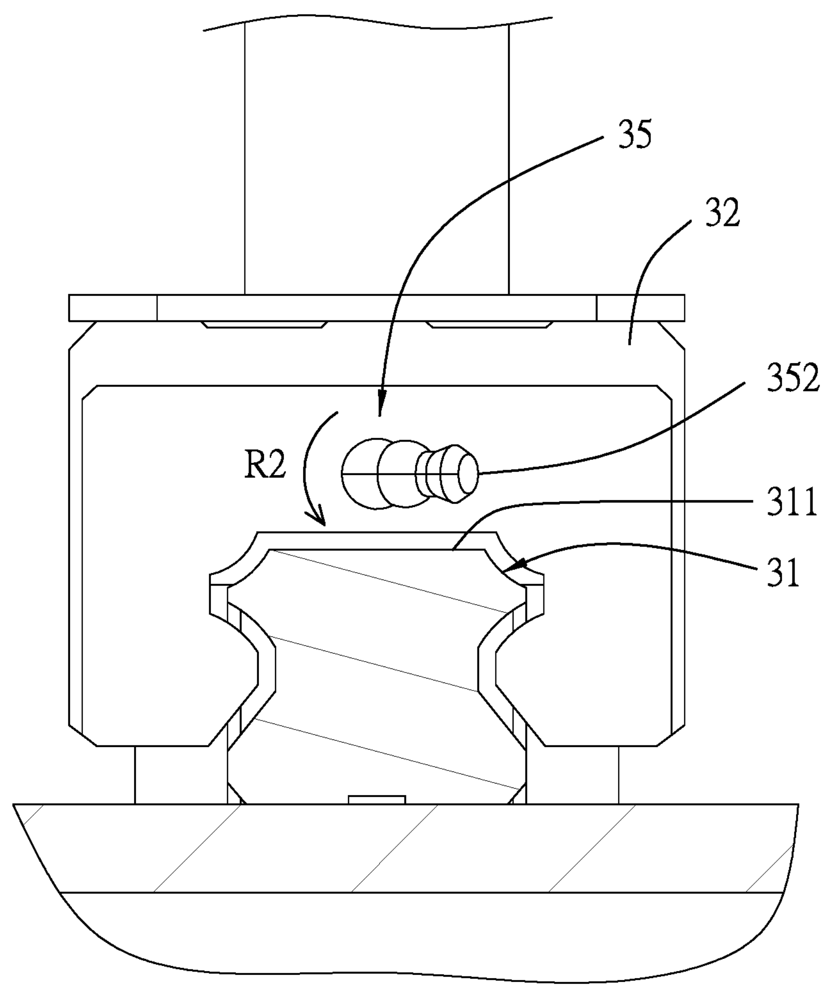
FIG. 7 is a partially enlarged sectional view of the embodiment illustrating a track brake of the support module in a non-braking position.
Figure 8:
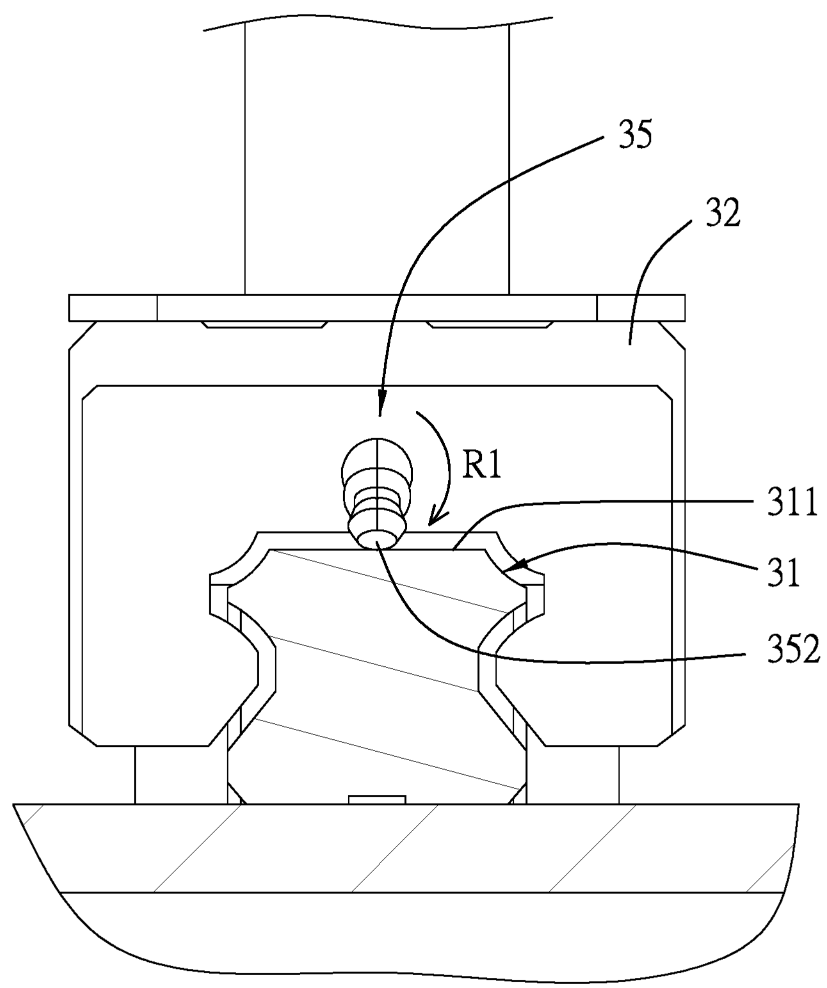
FIG. 8 is a view similar to FIG. 7, but illustrating the track brake 35 in a braking position.

As shown in FIGS. 6 to 8, to mount the support module 20 behind a shop window 5, the frame 21 at the bottom side is placed on a platform surface 51, and the front ends of the frames 21 is placed to contact with a back surface 521 of a window glass 52. As such, the front opening 25 is adjacent to the back surface 521. As the track brake 35 is in the non-braking position (see FIG. 7), a user may enter the receiving space 24 through a selected one of the front opening 25, the lateral openings 27 and the rear opening 26 and move the carrier 4 in the front-rear direction. To lock the carrier 4 at the rear position when the rear side of the sliding block 32 abuts the corresponding stop block 33 at the rear side, the track brake 35 may be rotated along a first rotating direction (R1) to the braking position (see FIG. 8) so that the carrier 4 is locked at a distance away from the front opening 25.

Figure 9:
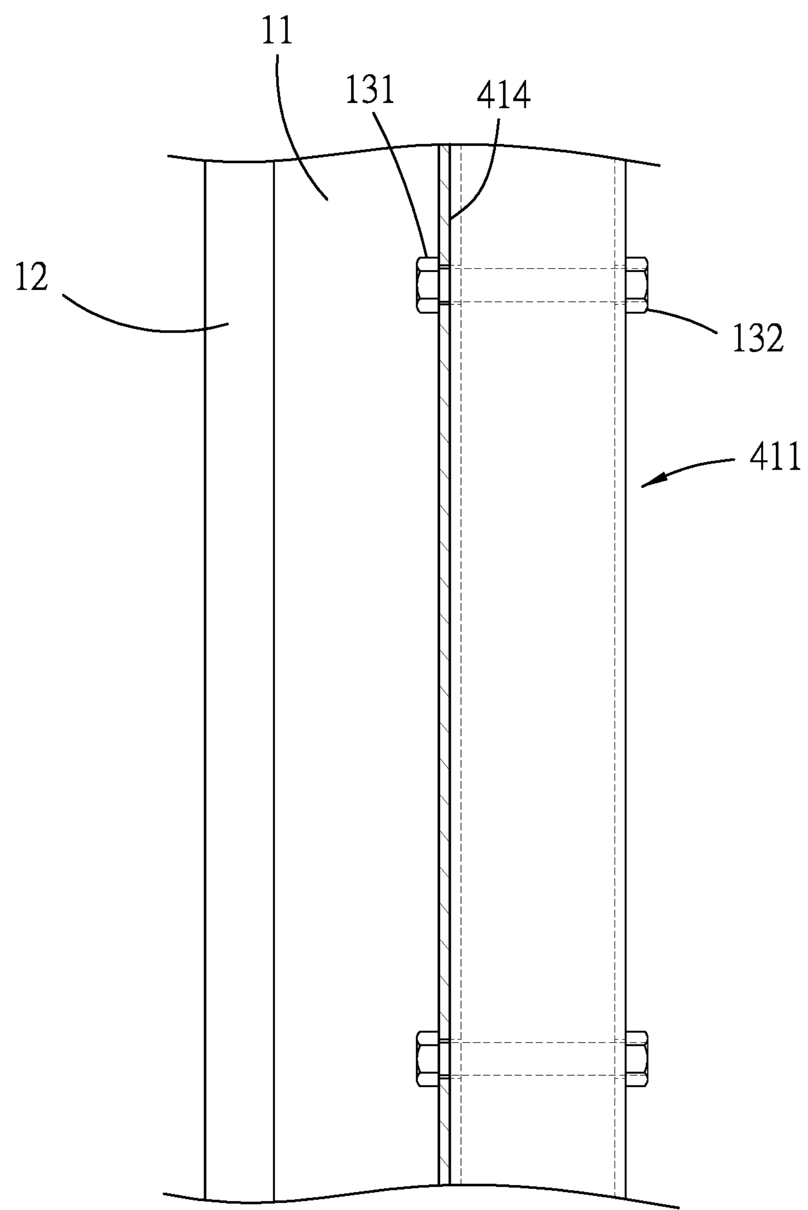
FIG. 9 is a partially fragmentary sectional view of the embodiment illustrating a display module and a carrier box secured to an upright rod 411 of the display apparatus.

As shown in FIGS. 6 and 9, as the carrier 4 is away from the front opening 25, the user may enter the receiving space 24 through one of the lateral openings 27 (see FIG. 2) to stand in front of the carrier 4 for installation of the display panel unit 10. During the installation of the display panel unit 10, rear plates 111 of the carrier boxes 11 are first secured to the installation surfaces 414 of the respective upright rods 411 by using bolts 131 and nuts 132. Afterwards, the display modules 12 are assembled to the respective carrier boxes 11. Because the carrier 4 is immobilized at the rear position, stability of the carrier 4 is enhanced during installation of the display panel unit 10 on the carrier 4.

Figure 10:
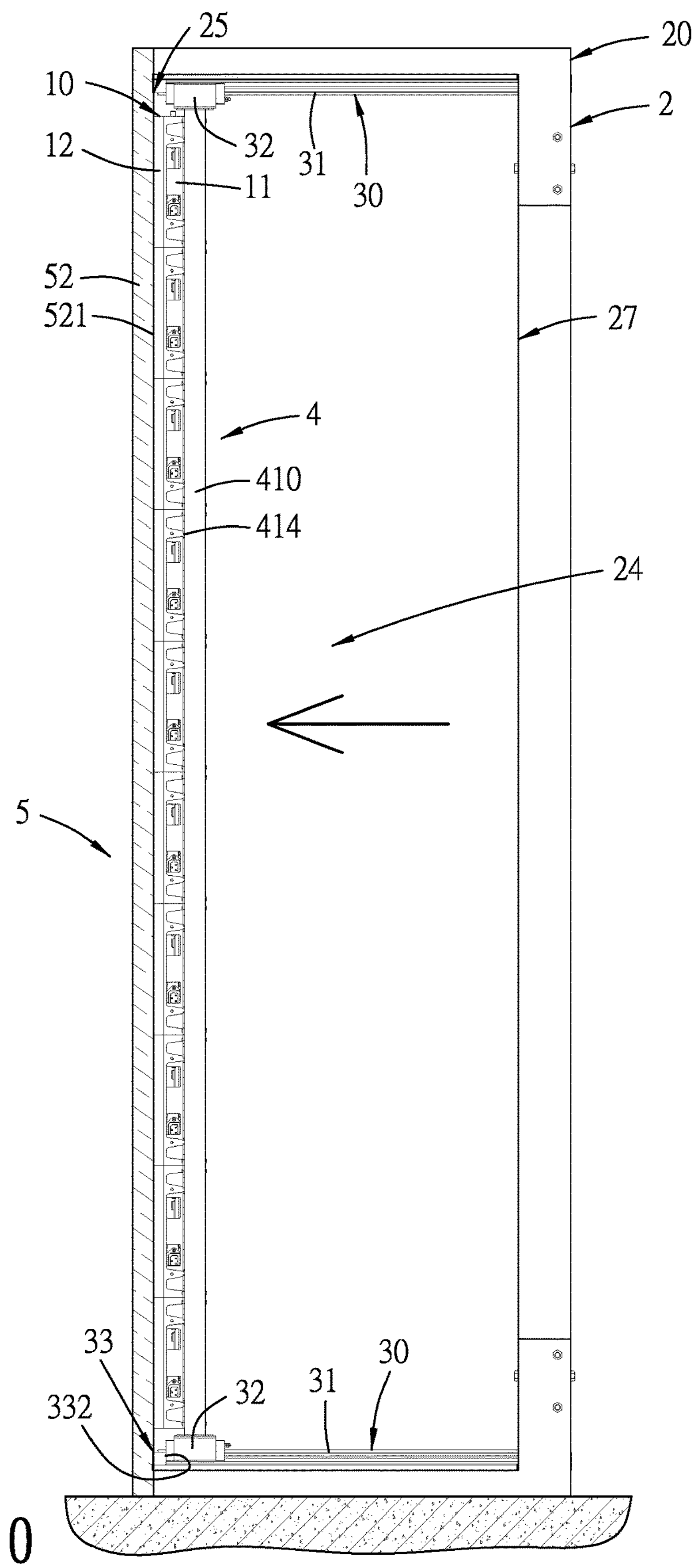
FIG. 10 is a partially sectional side view similar to FIG. 6, but illustrating the carrier moved and disposed behind a window 52 of the shop window.

As shown in FIGS. 7 and 10, when the installation of the display panel unit 10 is completed, the track brake 35 is rotated along a second rotating direction (R2) to the non-braking position (see FIG. 7) to unlock the carrier 4. Through one of the front opening 25, the lateral openings 27, and the rear opening 26, the user can enter the receiving space 24 and move the carrier together with the display panel unit 10 to the front opening 25. When the front side of the sliding block 32 abuts the corresponding stop block 33 at the front side, the carrier 4 reaches the front position. By rotating the track brake 35 along the first rotating direction (R1) (see FIG. 8) to the braking position, the carrier 4 is locked at the front position, so that the display modules 12 are closely contiguous to the back surface 521 of the window glass 52. As such, the viewing angle of the display panel unit 10 is increased to display images through the window glass 52.

As shown in FIGS. 6 and 7, to repair or maintain the display panel unit 10, the carrier 4 may be moved again toward the rear opening 26 so that the worker may enter the receiving space 24 to stand in front of the display panel unit 10 for maintenance. It is easy to detach, assemble or maintain each display module 12 and each carrier box 11.

As shown in FIGS. 2, 5, 6 and 10, because the rods 412 are connected between the upright rods 411, the structural strength of the carrier 4 is enhanced to prevent from deformation thereof, thereby ensuring that the installation surfaces 414 of the upright rods 411 are coplanar and constitute a coplanar surface that extends in top-bottom and left-right directions. By virtue of the end flange plates 413 of the upright rods 411 respectively connected to the sliding blocks 32, the carrier 4 is ensured to be stable when sliding in the front-rear direction. Because the installation surfaces 414 of the upright rods 411 are coplanar, the display modules 12 are disposed on the same plane. By virtue of the maintenance through holes 415 of the carrier 4, each carrier box 11 is easy to be maintained or replaced.

While it is illustrated hereinbefore by exemplifying that the carrier 4 is moved to the rear position for installation or maintenance of the display panel units 10, the carrier 4 may also be immobilized at a position between the front and rear position for installation or maintenance. Further, it is understandable that the housing framework 2 may have only one lateral opening 27 for entry into the receiving space 24 in other embodiments.

Figure 11:
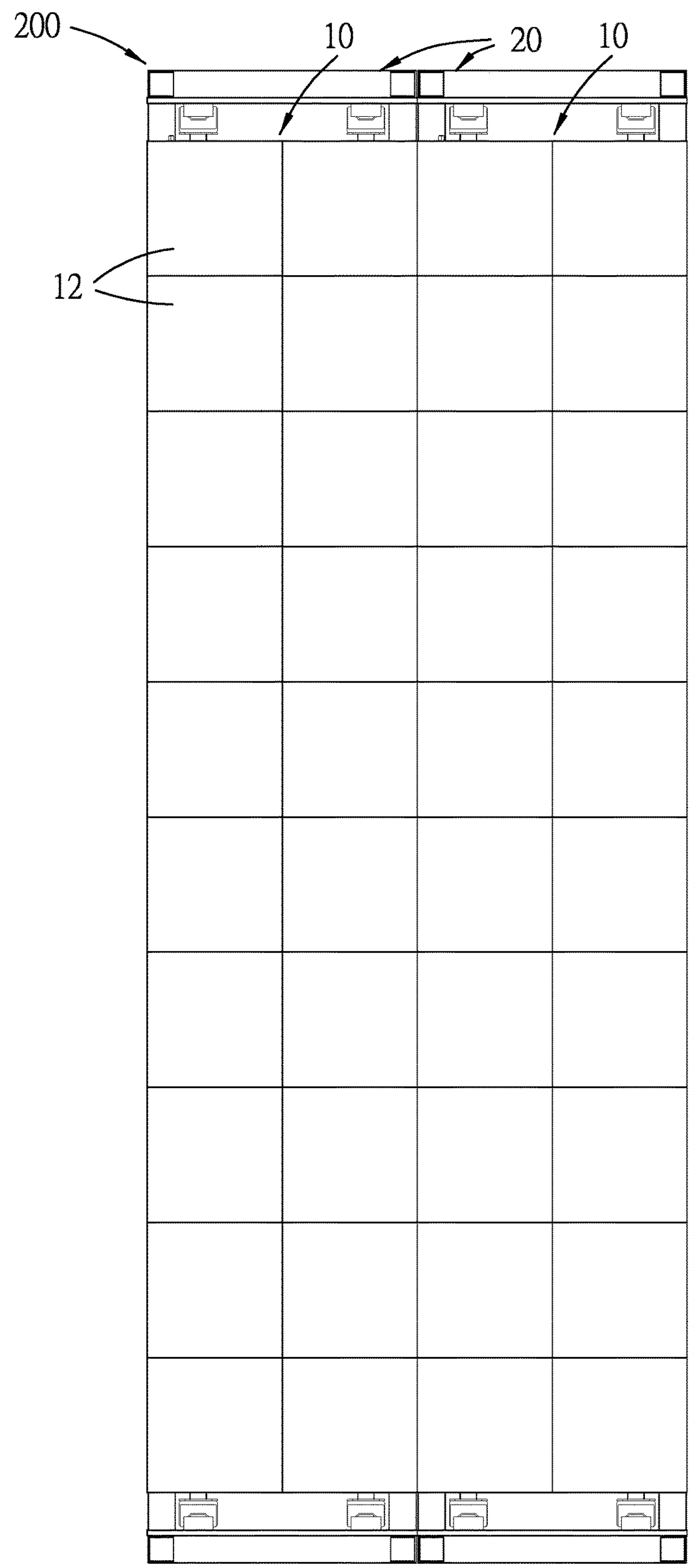
FIG. 11 is a front view illustrating a plurality of the support modules juxtaposed to each other and to support a plurality of the display panel units.
Figure 12:
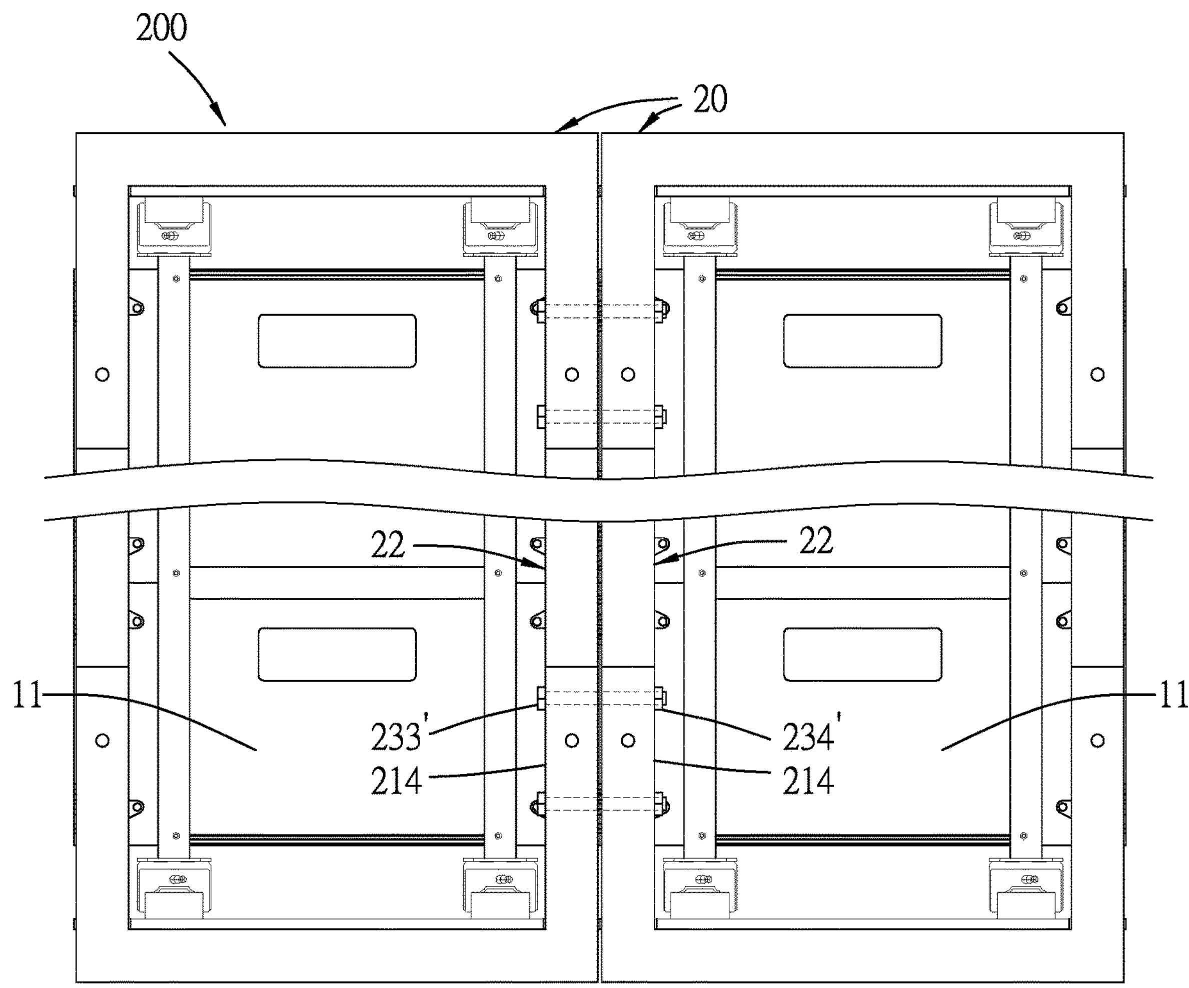
FIG. 12 is a fragmentary rear view of FIG. 11.

Referring to FIGS. 11 and 12, to assemble a plurality of the display panel units 10 for displaying a large size image, multiple support modules 20 are juxtaposed to each other in the left-right direction. To fix the support modules 20 in juxtaposition to each other, the sleeve pipes 214 of the support modules 20 are secured to each other by using bolts 233' and nuts 234'. In addition, to ensure that the display panel units 10 can be simultaneously moved, the carrier boxes 11 juxtaposed to each other are also secured together using bolts (not shown) and nuts (not shown).

In summary, by virtue of the carrier 4, the display panel unit 10 can be moved forward and placed in a position closely adjacent to the window glass so that the viewing angle of images presented by the display panel unit 10 can be enhanced. In addition, the display panel unit 10 can also be moved rewardly away from the window glass to facilitate installation, replacement or maintenance of the display panel unit 10.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A support module, comprising:

a housing framework including a top side, a bottom side, a front side, a rear side, left and right sides, a receiving space defined between said top and bottom sides, between said front and rear sides, and between said left and right lateral sides, a front opening formed at said front side in communication with said receiving space, and at least one lateral opening formed at one of said left and right sides in communication with said receiving space;

two guide rail units disposed within said receiving space and spaced apart from each other; and a carrier connected between said guide rail units and movable on said guide rail units toward and away from said front opening;

wherein said guide rail units are respectively disposed at said top and bottom sides of said housing framework;

wherein each of said guide rail units includes two slide rails spaced apart from each other in a left-right direction;

wherein said carrier is slidably connected to said slide rails of said guide rail units to move backward from said front opening, or forward towards said front opening;

wherein each of said slide rails includes a linear rail member extending in a front-rear direction, and a sliding block slidably connected to said linear rail member;

wherein said carrier includes two upright rods spaced apart from each other in the left-right direction, and a plurality of transverse rods connected between said upright rods and spaced apart from each other in a top-bottom direction, each of said upright rods having a top end connected to said sliding block of one of said slide rails of one of said guide rail units and a bottom end connected to said slide block of one of said slide rails of the other one of said guide rail units; and wherein each of said slide rails further includes two stop blocks disposed respectively on front and rear ends of said linear rail member, one of said stop blocks being used to abut a front side of said sliding block when said carrier is placed at a front position, the other one of said stop blocks being used to abut a rear side of said sliding block when said carrier is placed at a rear position.

2. The support module as claimed in claim 1, wherein said housing framework further has a rear opening disposed at said rear side in communication with said receiving space; and said at least one lateral opening includes two lateral openings disposed respectively at said left and right sides in communication with said receiving space.

3. The support module as claimed in claim 1, wherein said carrier includes a plurality of maintenance through holes that are spaced apart from each other in a top-bottom direction and that extend through front to rear carrier surfaces of said carrier.

4. The support module as claimed in claim 1, wherein each of said slide rails further includes a track brake pivotally connected to said sliding block, said track brake being rotatable relative to said sliding block to be placed in pressing contact with said linear rail member for locking said sliding block against movement.

5. The support module as claimed in claim 4, wherein each of said slide rails includes a linear slide member having a front end situated at said front side of said housing framework and a rear end situated at said rear side of said housing framework, and a slide block slidably disposed on said linear slide member and connected to said carrier.

6. The support module as claimed in claim 1, wherein said housing framework further includes two frames respectively disposed at said top and bottom sides, and two connection rods respectively disposed at said left and right sides, each of said connection rods being connected between rear ends of said frames;

said front opening is defined between front ends of said frames;

said frames and said connection rods cooperatively define said receiving space, said rear ends of said frames and said connecting rods cooperatively defining a rear opening disposed behind said receiving space;

said at least one lateral opening includes two lateral openings disposed respectively at said left-right sides, each of said frames has left and right lateral ends each connecting between said front and rear ends of a corresponding one of said frames, said left lateral ends of said frames and one of said connecting rods defining one of said lateral openings, said right lateral ends of said frames and the other one of said connecting rods defining the other one of said lateral openings;

said guide rail units are mounted respectively on said frames, each of said guide rail units including two slide rails that are attached to a surface of one of said frames facing said receiving space and that are spaced apart from each other in a left-right direction; and said carrier has upper and lower ends, each of which is connected slidably to said slide rails of one of said guide rail units.

7. A support assembly, comprising:

a plurality of support modules juxtaposed to each other in a left-right direction, each of said support modules includes a housing framework including a top side, a bottom side, a front side, a rear side, left and right lateral sides, a receiving space defined between said top and bottom sides, between said front and rear sides, and between said left and right lateral sides, a front opening formed at said front side in communication with said receiving space, and at least one lateral opening formed at one of said left and right sides in communication with said receiving space;

two guide rail units disposed within said receiving space and spaced apart from each other; and a carrier connected between said guide rail units and being movable on said guide rail units toward and away from said front opening;

wherein said guide rail units are respectively disposed at said top and bottom sides of said housing framework;

wherein each of said guide rail units includes two slide rails spaced apart from each other in a left-right direction;

wherein said carrier is slidably connected to said slide rails of said guide rail units to move backward from said front opening, or forward towards said front opening;

wherein each of said slide rails includes a linear rail member extending in a front-rear direction, and a sliding block slidably connected to said linear rail member;

wherein said carrier includes two upright rods spaced apart from each other in the left-right direction, and a plurality of transverse rods connected between said upright rods and spaced apart from each other in a top-bottom direction, each of said upright rods having a top end connected to said sliding block of one of said slide rails of one of said guide rail units and a bottom end connected to said slide block of one of said slide rails of the other one of said guide rail units; and wherein each of said slide rails further includes two stop blocks disposed respectively on front and rear ends of said linear rail member, one of said stop blocks being used to abut a front side of said sliding block when said carrier is placed at a front position, the other one of said stop blocks being used to abut a rear side of said sliding block when said carrier is placed at a rear position.

8. The support assembly as claimed in claim 7, wherein said housing frameworks of said support modules are secured to each other.

9. A display apparatus, comprising:

a display panel unit; and a support module including a housing framework including a top side, a bottom side, a front side, a rear side, left and right lateral sides, a receiving space defined between said top and bottom sides, between said front and rear sides, and between said left and right lateral sides, a front opening formed at said front side in communication with said receiving space, and at least one lateral opening formed at one of said left and right sides in communication with said receiving space, two guide rail units disposed within said receiving space and spaced apart from each other, and a carrier connected between said guide rail units and having front and rear carrier surfaces disposed between said front and rear sides of said housing framework, said front carrier surface carrying said display panel unit, said carrier together with said display panel unit being movable on said guide rail units toward and away from said front opening;

wherein said guide rail units are respectively disposed at said top and bottom sides of said housing framework;

wherein each of said guide rail units includes two slide assemblies spaced apart from each other in a left-right direction;

wherein said carrier is slidably connected to said slide rails of said guide rail units to move backward from said front opening, or forward towards said front opening;

wherein each of said slide rails includes a linear rail member extending in a front-rear direction, and a sliding block slidably connected to said linear rail member;

wherein said carrier includes two upright rods spaced apart from each other in the left-right direction, and a plurality of transverse rods connected between said upright rods and spaced apart from each other in a top-bottom direction, each of said upright rods having a top end connected to said sliding block of one of said slide rails of one of said guide rail units and a bottom end connected to said slide block of one of said slide rails of the other one of said guide rail units;

wherein said display unit is secured to said upright rods; and wherein each of said slide rails further includes two stop blocks disposed respectively on front and rear ends of said linear rail member, one of said stop blocks being used to abut a front side of said sliding block when said carrier is placed at a front position, the other one of said stop blocks being used to abut a rear side of said sliding block when said carrier is placed at a rear position.

10. The display apparatus as claimed in claim 9, wherein said housing framework further has a rear opening disposed at said rear side in communication with said receiving space; and said at least one lateral opening includes two lateral openings disposed respectively at said left and right sides in communication with said receiving space.

11. The display apparatus as claimed in claim 9, wherein said carrier includes a plurality of maintenance through holes that are spaced apart from each other in a top-bottom direction and that extend through front to rear carrier surfaces of said carrier.

12. The display apparatus as claimed in claim 9, wherein each of said slide rails further includes a track brake pivotally connected to said sliding block, said track brake being rotatable relative to said sliding block to be placed in pressing contact with said linear rail member for locking said sliding block against movement.

13. The display apparatus as claimed in claim 9, wherein said housing framework further includes two frames respectively disposed at said top and bottom sides, and two connection rods respectively disposed at said left and right sides, each of said connection rods being connected between rear ends of said frames;

said front opening is defined between front ends of said frames;

said frames and said connection rods cooperatively define said receiving space, said rear ends of said frames and said connecting rods cooperatively defining a rear opening disposed behind said receiving space;

said at least one lateral opening includes two lateral openings disposed respectively at said left-right sides;

each of said frames has left and right lateral ends each connecting between said front and rear ends of a corresponding one of said frames, said left lateral ends of said frames 21 and one of said connecting rods defining one of said lateral openings, said right lateral ends of said frames and the other one of said connecting rods defining the other one of said lateral openings;

said guide rail units are mounted respectively on said frames, each of said guide rail units including two slide rails that are attached to a surface of one of said frames facing said receiving space and that are spaced apart from each other in a left-right direction; and said carrier has upper and lower ends, each of which is connected slidably to said slide rails of one of said guide rail units.

* * * * *